US012644941B2

(12) United States Patent (10) Patent No.: US 12,644,941 B2

Kwack (45) Date of Patent: Jun. 2, 2026

(54) METHOD AND DEVICE FOR DISTINGUISHING HIGH-FAT VOXEL AND GENERATING FAT FRACTION MAP BY MEANS OF MAGNITUDE-BASED MULTI-ECHO MAGNETIC RESONANCE IMAGING

(71) Applicant: AJOU UNIVERSITY INDUSTRY-ACADEMIC COOPERATION FOUNDATION, Suwon-si (KR)

(72) Inventor: Kyu Sung Kwack, Suwon-si (KR)

(73) Assignee: AJOU UNIVERSITY INDUSTRY-ACADEMIC COOPERATION FOUNDATION, Suwon-si (KR)

( * ) Notice: Subject to any disclaimer, the term of this patent is extended or adjusted under 35 U.S.C. 154(b) by 438 days.

(21) Appl. No.: 18/283,362

(22) PCT Filed: Mar. 16, 2022

(86) PCT No.: PCT/KR2022/003669

§ 371 (c)(1),
(2) Date: Jul. 26, 2024

(87) PCT Pub. No.: WO2022/203273

PCT Pub. Date: Sep. 29, 2022

(65) Prior Publication Data

US 2025/0291012 A1     Sep. 18, 2025

(30) Foreign Application Priority Data

Mar. 24, 2021     (KR) ......................... 10-2021-0037911

(51) Int. Cl.
G01R 33/48        (2006.01)
G01R 33/56        (2006.01)

(52) U.S. Cl.
CPC ..... G01R 33/4828 (2013.01); G01R 33/5608 (2013.01)

(58) Field of Classification Search
CPC ....................... G01R 33/4828; G01R 33/5608; G01R 33/48; G01R 33/56; A61B 5/00;
(Continued)

(56) References Cited

U.S. PATENT DOCUMENTS

2011/0091090 A1*   4/2011   Dahlqvist Leinhard ....................
G01R 33/4828
324/309
2017/0097400 A1     4/2017   Nakai

FOREIGN PATENT DOCUMENTS

WO        2015-190508  A1    12/2015

OTHER PUBLICATIONS

Office Action issued in corresponding Korean Patent Application No. 10-2021-0037911, dated Feb. 13, 2024 (17 pages).
(Continued)

*Primary Examiner* — G.M. A Hyder
(74) *Attorney, Agent, or Firm* — Osha Bergman Watanabe & Burton LLP

(57)        ABSTRACT

The present disclosure relates to a method and device for distinguishing a high-fat voxel and generating a fat fraction map by means of magnitude-based multi-echo magnetic resonance imaging, the method including obtaining, with a magnetic resonance scanner, three or more opposed-phase OP image data corresponding to an opposed-phase and three or more in-phase IP image data corresponding to an in-phase in accordance with a plurality of echo times of a subject, confirming, with the magnetic resonance scanner, a voxel value for voxels constituting each of the image data, determining, with the magnetic resonance scanner, a high-fat voxel in which high-fat is located among the image data (Continued)

based on the voxel value, and generating, with the magnetic resonance scanner, a fat fraction map by selectively applying different fat fraction equations in accordance with a result of the determination of the high-fat voxel, and may be applied to other embodiments.

21 Claims, 6 Drawing Sheets

(58) Field of Classification Search
CPC ..... A61B 5/055; A61B 5/0033; A61B 5/4872; A61B 5/7203; G16H 30/20; G16H 30/40; G06T 5/70; G06T 2207/20182
See application file for complete search history.

(56) References Cited

OTHER PUBLICATIONS

Yuri A. Costa et al., "Full-Range Liver Fat Fraction Estimation in Magnitude MRI Using a Signal Shape Descriptor", Concepts in Magnetic Resonance Part A, Jun. 2, 2019., vol. 2019, No. 3739468, pp. 1-11 (12 pages).
Chia-Ying Liu et al., "Fat Quantification With Ideal Gradient Echo Imaging: Correction of Bias From T1 and Noise", Magnetic Resonance in Medicine, Jul. 24, 2007., vol. 58, pp. 354-364 (11 pages).
International Search Report and Written Opinion in corresponding International Application No. PCT/KR2022/003669, dated Jul. 5, 2022 (10 pages).
Shin, Hyun Joo et al. Normal range of hepatic fat fraction on dual-and triple-echo fat quantification MR in children. PloS one. 2015, vol. 10, No. 2: e0117480, pp. 1-10 (10 pages).
Sood, Rewa. Quantification of Liver Fat Using Magnetic Resonance Imaging. University of Illinois at Urbana-Champaign. 2017 (20 pages).
Bray, Timothy JP et al. Fat fraction mapping using magnetic resonance imaging: insight into pathophysiology. The British journal of radiology. 2017, vol. 91, No. 1089: 20170344, pp. 1-14 (14 pages).
Roberts, Nathan T. et al. Noise properties of proton density fat fraction estimated using chemical shift-encoded MRI. Magnetic resonance in medicine. 2018, vol. 80, No. 2: 685-695, pp. 1-26 (26 pages).

* cited by examiner

METHOD AND DEVICE FOR DISTINGUISHING HIGH-FAT VOXEL AND GENERATING FAT FRACTION MAP BY MEANS OF MAGNITUDE-BASED MULTI-ECHO MAGNETIC RESONANCE IMAGING

FIELD

The present disclosure relates to a method and device for distinguishing a high-fat voxel and generating a fat fraction map by means of magnitude-based multi-echo magnetic resonance imaging.

BACKGROUND

A magnetic resonance imaging (MRI) scanner is a device that uses a magnetic field to image an object, and is widely used for accurate disease diagnosis because it shows bone, bone marrow, disc, and joints as well as liver, spleen, pancreas, and visceral fat in three dimensions at a desired angle. Recently, magnetic resonance imaging (MRI) has been widely used for diagnosis of fatty liver, obesity, bone marrow, and metastatic cancer as well as spinal, brain, and joint diseases.

Magnetic resonance signals of interest in most clinical medicine are magnetic resonance signals of water obtained from hydrogen atoms in the subject or lesion. However, there is not only hydrogen contained in water but also hydrogen contained in fat in the object, and a fat signal fraction map (hereinafter, referred to as a fat fraction map) can be created by calculating a ratio of water and fat signals obtained from human organs or lesions. The obtained fat signal fraction (hereinafter, referred to as a fat fraction) value or the fat fraction map representing the value in an image may be used for diagnosis of various diseases including the above diseases. One of the techniques of separating water and fat signals that have been conventionally used is the DIXON technique. However, in the case of the conventional DIXON fat fraction map made in this way, there was a problem in that the fat fraction of the fat dominant tissue cannot be properly expressed due to a phenomenon called water-fat ambiguity. For example, there was a problem in that the fat signal fraction of a high-fat voxel located in the fat dominant tissue with an actual fat signal fraction of 80% was misrepresented as 20% (100−80=20%).

Various methods have been developed to overcome this problem, but most of them cannot be implemented using magnitude MR images alone and require additional phase MR image data, or MR images must be obtained with atypical arbitrary echo intervals and perform complex calculations when obtaining multiple echo MR images. In this case, there is a lack of compatibility between MR devices, and it is also difficult to create a fat fraction map with only the magnitude MR images data already transmitted to a server or portable storage device.

SUMMARY

According to an aspect of the present disclosure, there is provided a method and device for generating a fat fraction map by distinguishing a high-fat voxel using a magnitude-based multi-echo MR image capable of distinguishing whether each voxel of an image cross section is a voxel located in a high-fat by using only magnitude-based multi-echo magnetic resonance image data, and generating a fat fraction map capable of accurately measuring a fat fraction of a fat dominant tissue by applying a differentiated equation to the distinguished high-fat voxel and the non-high-fat voxel.

According to an embodiment of the present disclosure, a method for distinguishing a high-fat voxel and generating a fat fraction map includes: obtaining, with a magnetic resonance scanner, three or more opposed-phase OP image data corresponding to an opposed-phase and three or more in-phase IP image data corresponding to an in-phase in accordance with a plurality of echo times of a subject; confirming, with the magnetic resonance scanner, a voxel value for voxels constituting each of the image data; determining, with the magnetic resonance scanner, a high-fat voxel in which high-fat is located among the image data based on the voxel value; and generating, with the magnetic resonance scanner, a fat fraction map by selectively applying different fat fraction equations in accordance with a result of the determination of the high-fat voxel.

In addition, the obtaining the three or more OP image data corresponding to the opposed-phase and the three or more IP image data corresponding to the in-phase may include sequentially obtaining first OP image data, first IP image data, second OP image data, second IP image data, third OP image data, third IP image data, and fourth OP image data.

In addition, the determining the high-fat voxel may include comparing the voxel value for the same voxels in the third IP image data and the fourth OP image data, and when the voxel value of the third IP image data is equal to or less than the voxel value of the fourth OP image data, determining the corresponding voxel as the high-fat voxel.

In addition, the determining the high-fat voxel may include comparing the voxel value for the same voxels in the third OP image data and the fourth OP image data, and when the voxel value of the third OP image data is equal to or less than the voxel value of the fourth OP image data, determining the corresponding voxel as the high-fat voxel.

In addition, the determining the high-fat voxel may include comparing the voxel value for the same voxels in the second OP image data and the third OP image data, and when the voxel value of the second OP image data is equal to or less than the voxel value of the third OP image data, determining the corresponding voxel as the high-fat voxel.

In addition, the generating the fat fraction map may include calculating a fat fraction value by applying a first fat fraction equation to the determined high-fat voxel.

In addition, the generating the fat fraction map may include calculating a fat fraction value by applying a second fat fraction equation to a voxel other than the high-fat voxel.

In addition, the generating the fat fraction map may include generating the fat fraction map using the calculated fat fraction value.

In addition, after the generating the fat fraction map, may further include removing, with the magnetic resonance scanner, noise of the fat fraction map, and reconstructing the fat fraction map.

In addition, the removing the noise may include determining a voxel satisfying any one of a first condition, a second condition, a third condition, and a fourth condition as noise and removing the noise from the fat fraction map.

In addition, the first condition may be a condition for determining whether a voxel among the plurality of voxels constituting the fat fraction map is less than a first threshold or exceeding a second threshold.

In addition, the second condition may be a condition for confirming whether the voxel value of the first IP image data is less than or equal to the voxel value of the second OP image data based on a comparison result of the voxel value for the same voxels in the first IP image data and second OP image data.

In addition, the third condition may be a condition for confirming whether the voxel value of the first IP image data is less than or equal to the voxel value of the second IP image data based on a comparison result of the voxel value for the same voxels in the first IP image data and second IP image data.

In addition, the fourth condition may be a condition for confirming whether a difference value of the voxel value of the voxels comprising the first IP image data minus the voxel value of the voxels comprising the second OP image data is less than or equal to the voxel value of the voxels comprising the first IP image data multiplied by a threshold value.

In addition, according to an embodiment of the present disclosure, a method for distinguishing a high-fat voxel and generating a fat fraction map includes: a measuring portion configured to obtain three or more opposed-phase OP image data corresponding to an opposed-phase and three or more in-phase IP image data corresponding to an in-phase in accordance with to a plurality of echo times of a subject; and a controller configured to confirm a voxel value for voxels constituting each of the image data, determine a high-fat voxel in which high-fat is located among the image data based on the voxel value, and generate a fat fraction map by selectively applying different fat fraction equations in accordance with a result of the determination of the high-fat voxel.

In addition, the measuring portion may obtain first OP image data, first IP image data, second OP image data, second IP image data, third OP image data, third IP image data, and fourth OP image data.

In addition, when the voxel value of the third IP image data is equal to or less than the voxel value of the fourth OP image data for to the same voxels or the voxel value of the third OP image data is equal to or less than the voxel value of the fourth OP image data or the voxel value of the second OP image data is equal to or less than the voxel value of the third OP image data, the controller may determine the corresponding voxel as the high-fat voxel.

In addition, the controller may calculate a fat fraction value by applying a first fat fraction equation to the determined high-fat voxel.

In addition, the controller may calculate a fat fraction value by applying a second fat fraction equation to a voxel other than the high-fat voxel.

In addition, the controller may generate the fat fraction map using the calculated fat fraction value, remove noise of the fat fraction map, and reconstruct the fat fraction map.

In addition, the controller may determine a voxel that satisfies a first condition in the fat fraction map or that satisfies any one of a second condition, a third condition, and a fourth condition in at least two image data among the plurality of image data as noise and remove the noise from the fat fraction map.

As described above, the method and device for generating a fat fraction map by distinguishing a high-fat voxel using a magnitude-based multi-echo magnetic resonance images according to the present disclosure may distinguish whether each voxel is a voxel located in a high-fat region using only magnitude-based multi-echo magnetic resonance image data, and may generate a fat fraction map (0-100% full range fat fraction map) thereby accurately measuring a fat fraction of a fat dominant tissue, more accurately expressing fat fraction values of a high-fat organ and a high-fat lesion, and allowing measurement.

DETAILED DESCRIPTION

Figure 1:
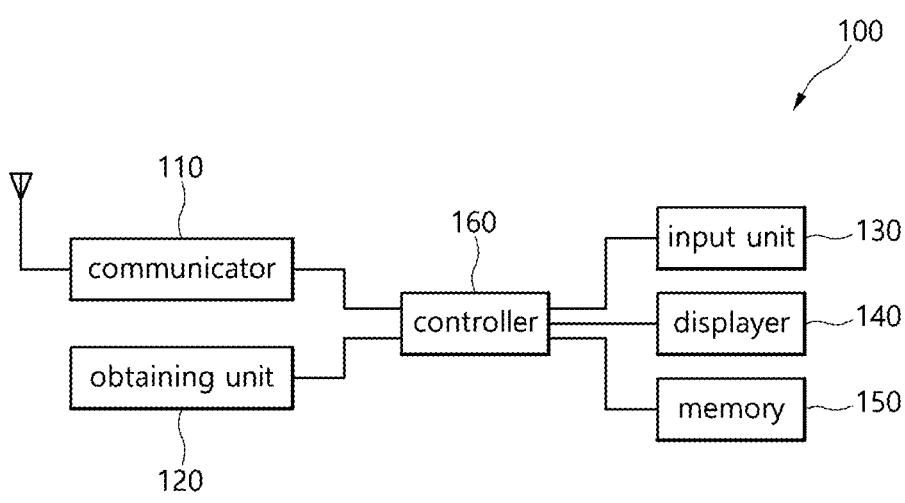
FIG. 1 is a block diagram illustrating a main configuration of a magnetic resonance scanner according to an embodiment of the present disclosure.

Hereinafter, preferred embodiments according to the present disclosure will be described in detail with reference to the accompanying drawings. The detailed description that will be set forth below in conjunction with the accompanying drawings is intended to describe exemplary embodiments of the invention and is not intended to represent the only embodiments in which the invention may be practiced. In the drawings, parts irrelevant to the description may be omitted to clearly describe the present disclosure, and the same reference numerals may be used for the same or similar components throughout the specification.

FIG. 1 is a block diagram illustrating a main configuration of a magnetic resonance scanner according to an embodiment of the present disclosure.

Referring to FIG. 1, the magnetic resonance scanner 100 according to the present disclosure includes a communicator 110, an obtaining unit 120, an input unit 130, a displayer 140, a memory 150, and a controller 160. In addition, in an embodiment of the present disclosure, the magnetic resonance scanner 100 described using a 3 Tesla MRI device as an example, but is not limited thereto.

The communicator 110 communicates with an external device (not shown), for example, an electronic device such as a server, a medical device, a smart phone, a tablet PC, and the like. To this end, the communicator 110 may perform wireless communication such as 5th generation communication (5G), long term evolution (LTE), long term evolution-advanced (LTE-A), wireless fidelity (Wi-Fi), or the like, and may perform wired communication using a cable.

The obtaining unit 120 obtains a plurality of image data corresponding to a plurality of echo times for a subject under the control of the controller 160 and provides the obtained image data to the controller 160. At this time, the plurality of image data includes a plurality of opposed-phase OP image data and a plurality of in-phase IP image data. The plurality of image data may be sequentially obtained by the first OP image data (OP1), the first IP image data (IP1), the second OP image data (OP2), the second IP image data (IP2), the third OP image data (OP3), the third IP image data (IP3), and the fourth OP image data (OP4). This will be described in more detail with reference to FIG. 2 below.

Figure 2:
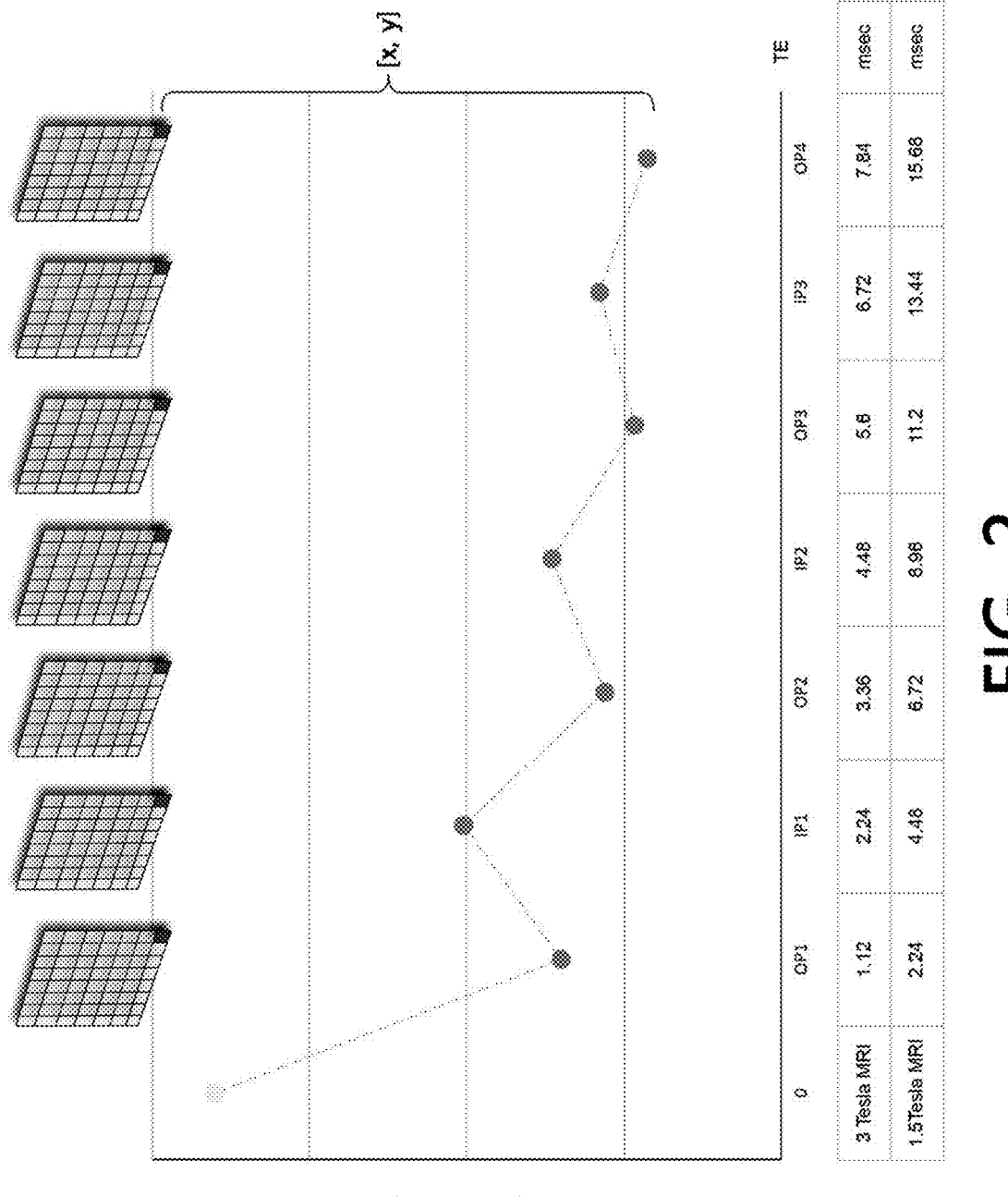
FIG. 2 is a diagram for illustrating a change in a signal intensity of voxels for each of a plurality of opposed-phase image data and in-phase image data according to an embodiment of the present disclosure.

FIG. 2 illustrates an obtainment order and echo time of a plurality of opposed-phase image data and in-phase image data according to an embodiment of the present disclosure, and is a diagram illustrating a change and difference in signal intensity between a plurality of OP image data and IP image data, respectively, between voxels at the same position.

Referring to FIG. 2, in the graph, a vertical axis means signal intensity of each voxel, and a horizontal axis means echo time, which is a parameter when obtaining a magnetic resonance image, and may be expressed in units of msec. Since the difference in the chemical shift frequency between water and fat is about 3.5 ppm, the magnetic field strength 3 Tesla MRI device may obtain image data at an interval of about 1.12 msec in order to obtain OP image data and IP image data of water and fat. In 1.5 Tesla MRI, OP image data and IP image data may be obtained at an interval of about 2.24 msec.

The input unit 130 generates input data in response to an input of a user of the magnetic resonance scanner 100. To this end, the input unit 130 may include an input device such as a keyboard, a mouse, a keypad, a dome switch, a touch panel, a touch pen, a touch key, or a button.

The displayer 140 outputs output data according to an operation of the magnetic resonance scanner 100. To this end, the displayer 140 may include a display device such as a liquid crystal display (LCD), a light emitting diode (LED) display, or an organic LED (OLED) display. In addition, the displayer 140 may be combined to the input unit 130 to be implemented in the form of a touch screen.

The memory 150 stores operation programs of the magnetic resonance scanner 100. In particular, the memory 150 may store a magnetic resonance image received from the communicator 110 or a magnetic resonance image obtained by the obtaining unit 120. The memory 150 may store an algorithm including an equation that may generate a fat fraction map using the magnetic resonance image. In addition, the memory 150 may store the generated fat fraction map.

The controller 160 controls the obtaining unit 120 to obtain a plurality of image data using a DIXON technique. The controller 160 confirms each voxel value constituting a plurality of image data of the subject obtained by the obtaining unit 120. More specifically, the controller 160 determines that the voxels constituting the third IP image data have a voxel value equal to or less than the voxel value of the voxels constituting the fourth OP image data, the voxels constituting the third OP image data have a voxel value equal to or less than the voxel value of the voxels constituting the fourth OP image data, or the voxels constituting the second OP image data have a voxel value equal to or less than the voxel value of the voxels constituting the third OP image data are high-fat voxels. The controller 160 calculates a fat fraction value of the corresponding voxel by applying a first fat fraction equation to the high-fat voxel. In addition, the controller 160 calculates the fat fraction value of the corresponding voxel by applying a second fat fraction equation to the voxel, not the high-fat voxel.

The controller 160 generates a fat fraction map using the calculated fat fraction values for all voxels. The controller 160 removes noise from the generated fat fraction map. In this case, the noise includes MRI noise and MRI flow artifacts by flowing liquid. When the generated fat fraction map satisfies any one of the first condition, second condition, third condition, and fourth condition, the controller 160 removes noise by replacing the corresponding voxel value on the fat fraction map with zero and reconstructs the generated fat fraction map. Finally, the control unit 160 displays the reconstructed fat fraction map with noise removed on the displayer 140.

Figure 3:
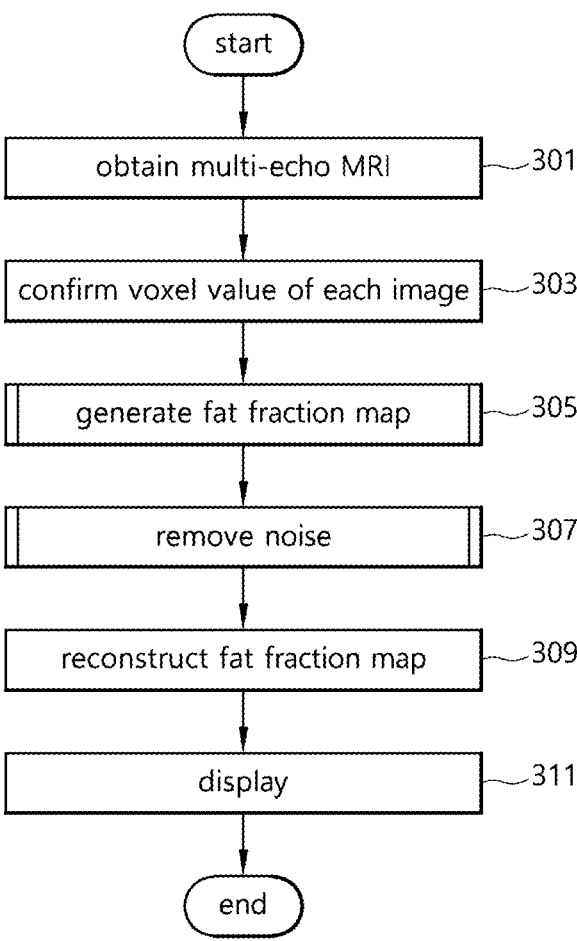
FIG. 3 is a flowchart illustrating a method of distinguishing a high-fat voxel and generating a fat fraction map according to an embodiment of the present disclosure.

FIG. 3 is a flowchart illustrating a method of distinguishing a high-fat voxel and generating a fat fraction map according to an embodiment of the present disclosure.

Referring to FIG. 3, in step S301, the controller 160 controls the obtaining unit 120 to obtain a plurality of image data corresponding to a plurality of echo times for a subject. At this time, the plurality of image data includes a plurality of opposed-phase OP image data and a plurality of in-phase IP image data. The plurality of image data may be sequentially obtained by the first OP image data, the first IP image data, the second OP image data, the second IP image data, the third OP image data, the third IP image data, and the fourth OP image data.

Figure 4:
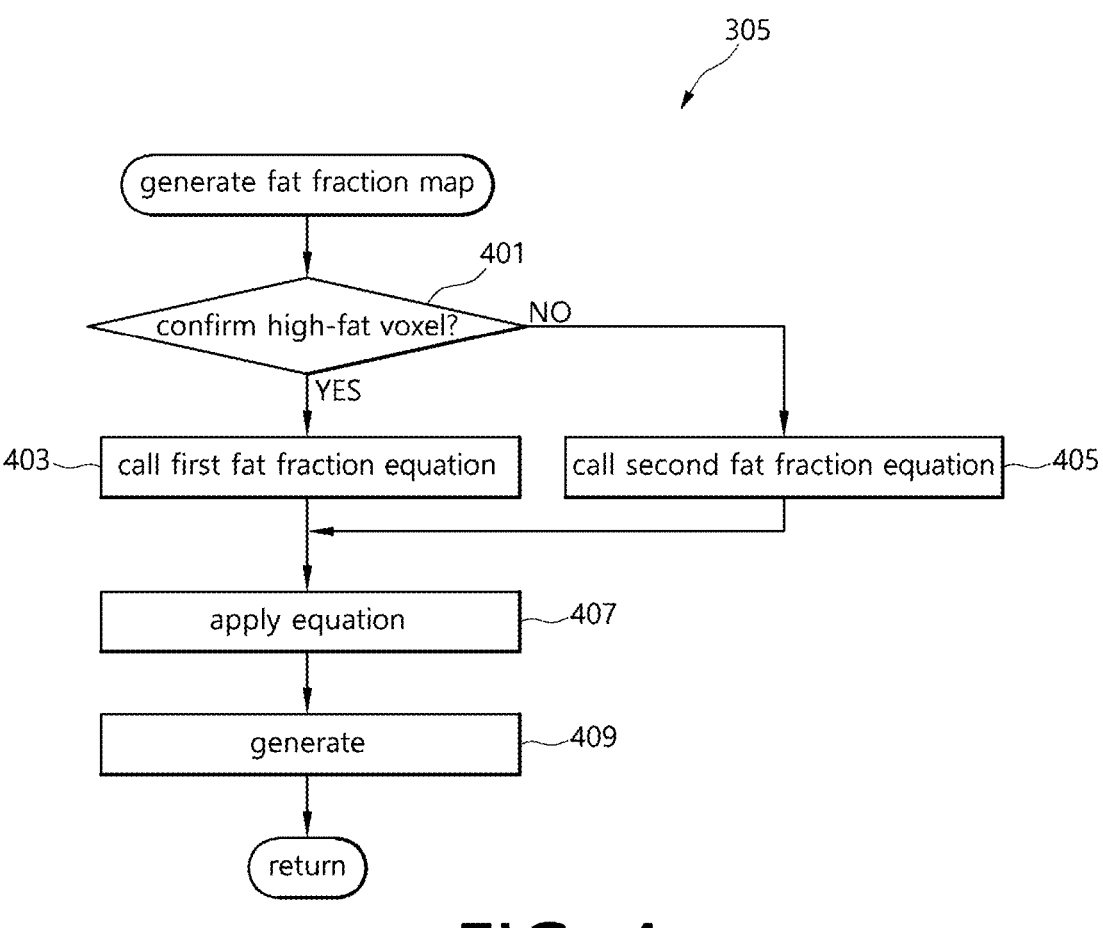
FIG. 4 is a detailed flowchart illustrating a method for generating a fat fraction map according to whether a high-fat voxel exists or not according to an embodiment of the present disclosure.

In step S303, the controller 160 confirms each voxel value constituting the obtained plurality of image data. In step S305, the controller 160 generates a fat fraction map based on the confirmed voxel value. A method for generating a fat fraction map will be described in more detail using FIG. 4 below. FIG. 4 is a detailed flowchart illustrating a method for generating a fat fraction map according to whether a high-fat voxel exists or not according to an embodiment of the present disclosure.

Referring to FIG. 4, in step S401, when voxels constituting the image data satisfy a determination condition, the controller 160 determines the voxel as a high-fat voxel where a high-fat is located. More specifically, the controller 160 determines that the voxels constituting the third IP image data have a voxel value equal to or less than the voxel value of the voxels constituting the fourth OP image data, the voxels constituting the third OP image data have a voxel value equal to or less than the voxel value of the voxels constituting the fourth OP image data, or the voxels constituting the second OP image data have a voxel value equal to or less than the voxel value of the voxels constituting the third OP image data are high-fat voxels, and performs step S403. At this time, the conditional equation related to the determination condition is as shown in Equation 1 below.

$$IP3 \cdot px[x, y] \leq OP4 \cdot px[x, y], \qquad (1)$$

$$OP3 \cdot px[x, y] \leq OP4 \cdot px[x, y],$$

$$OP2 \cdot px[x, y] \leq OP3 \cdot px[x, y]$$

Here, $px[x, y]$ represents coordinates of voxels constituting each image data and signal intensity values stored in the voxels.

In step S403, the controller 160 calls a first fat fraction equation for calculating a fat fraction value and performs step S407. In step S407, the controller 160 calculates the fat fraction value of the corresponding voxel by applying the first fat fraction equation and performs step S409. The first fat fraction equation is as shown in Equation 2 below.

$$FF(\%) = \frac{\frac{IP1 \cdot px[x, y] + IP2 \cdot px[x, y]}{2} + OP2 \cdot px[x, y]}{2 * \frac{IP1 \cdot px[x, y] + IP2 \cdot px[x, y]}{2}} * 100 \qquad (2)$$

In this case, $IP1.px[x, y]$ represents a signal intensity value stored in $[x, y]$ coordinate voxels of the first IP image data, $IP2.px[x, y]$ represents a signal intensity value stored in $[x, y]$ coordinate voxels of the second IP image data, and OP2.px[x, y] represents a signal intensity value stored in [x, y] coordinate voxels of the second OP image data.

On the contrary, in step S401, the controller 160 determines that the remaining voxels that do not satisfy the determination condition of the high-fat voxel are not high-fat voxels, and performs step S405.

In step S405, the controller 160 calls a second fat fraction equation and performs step S407. In step S407, the controller 160 calculates a fat fraction value of the corresponding voxel by applying the second fat fraction equation and performs step S409. The second fat fraction equation is as shown in Equation 3 below.

$$FF(\%) = \frac{\dfrac{IP1 \cdot px[x,\,y] + IP2 \cdot px[x,\,y]}{2} - OP2 \cdot px[x,\,y]}{2 * \dfrac{IP1 \cdot px[x,\,y] + IP2px[x,\,y]}{2}} * 100 \qquad (3)$$

In step S409, the controller 160 generates a fat fraction map using the fat fraction values for all voxels calculated in step S407 using the equation called in step S403 or S405 and returns to step S307 of FIG. 3.

Figure 5:
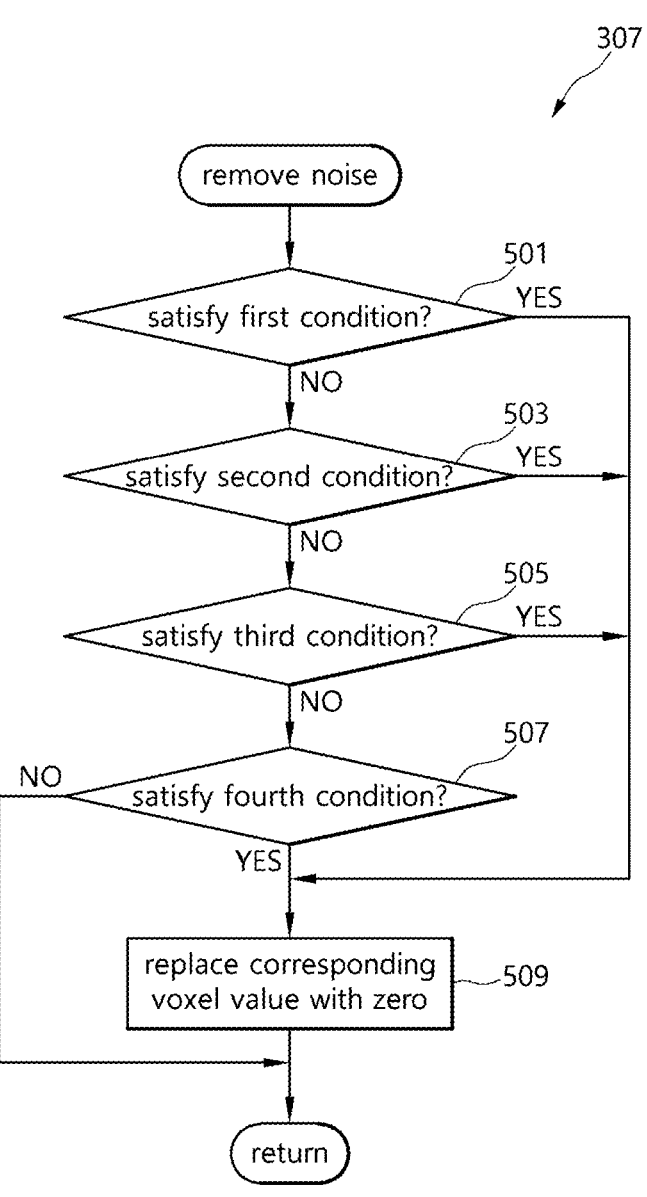
FIG. 5 is a detailed flowchart illustrating a method of removing noise from a calculated fat fraction map according to an embodiment of the present disclosure.

Then, in step S307, the controller 160 removes noise from the generated fat fraction map. Here, the method of removing noise will be described in more detail using FIG. 5 below. FIG. 5 is a detailed flowchart illustrating a method of removing noise from a calculated fat fraction map according to an embodiment of the present disclosure.

Referring to FIG. 5, in step S501, the controller 160 performs step S509 when the fat fraction map generated in FIG. 4 satisfies the first condition, and performs step S503 when the first condition is not satisfied. More specifically, when a voxel value smaller than 0 or greater than 110 exists among the voxel values of the voxels constituting the fat fraction map generated in FIG. 4, the controller 160 performs step S509 and replaces the voxel value of the corresponding voxel with zero. In this case, the condition equation related to the first condition is as shown in Equation 4 below.

$$FF \cdot px[x,\,y] < 0, \qquad (4)$$

$$FF \cdot px[x,\,y] > 110$$

In this case, FF.px[x, y] means coordinates and % values of voxels constituting the fat fraction map generated in step S409.

In step S503, the controller 160 performs step S509 when at least two image data among the plurality of image data satisfy the second condition, and performs step S505 when the second condition is not satisfied. More specifically, when a voxel value of voxels constituting the first IP image data is less than or equal to a voxel value of voxels constituting the second OP image data, the controller 160 performs step S509. In step S509, the controller 160 confirms a voxel having a voxel value of voxels constituting the first IP image data equal to or less than a voxel value of voxels constituting the second OP image data, and replaces a voxel value of the same voxel as the corresponding voxel in the fat fraction map with zero. In this case, the condition equation related to the second condition is as shown in Equation 5 below.

$$IP1[x,\,y] \le OP2 \cdot px[x,\,y] \qquad (5)$$

In step S505, when at least two image data among the plurality of image data satisfy a third condition, the controller 160 performs step S509, and when the at least two image data do not satisfy the third condition, the controller 160 performs step S507. More specifically, when a voxel value of voxels constituting the first IP image data is equal to or less than a voxel value of voxels constituting the second IP image data, the controller 160 performs step S509. In step S509, the controller 160 determines a voxel having a voxel value of voxels constituting the first IP image data equal to or less than a voxel value of voxels constituting the second IP image data, and replaces a voxel value of the same voxel as the corresponding voxel in the fat fraction map with zero. At this time, the conditional equation related to the third condition is as shown in Equation 6 below.

$$IP1 \cdot px[x,\,y] \le IP2 \cdot px[x,\,y] \qquad (6)$$

In step S507, when at least two image data among the plurality of image data satisfy a fourth condition, the controller 160 performs step S509, and when the at least two image data do not satisfy the fourth condition, the controller 160 ends the process and returns to step S309 of FIG. 3. More specifically, when a difference value of the voxel value of the voxels comprising the first IP image data minus the voxel value of the voxels comprising the second OP image data is less than or equal to the voxel value of the voxels comprising the first IP image data multiplied by 0.1, the controller 160 checks the corresponding voxel and replaces the voxel value of the voxel identical to the corresponding voxel in the fat fraction map with zero. Here, the conditional equation related to the fourth condition is as shown in Equation 7 below.

$$(IP1 \cdot px[x,\,y] - OP2 \cdot px[x,\,y]) \le (0.1 * IP1 \cdot px[x,\,y]) \qquad (7)$$

Next, in step S309, the controller 160 reconstructs the fat fraction map generated in FIG. 4 by removing the noise as shown in FIG. 5. In step S311, the controller 160 displays the reconstructed fat fraction map on the displayer 140 and stores the fat fraction map as a DICOM file.

Figure 6:
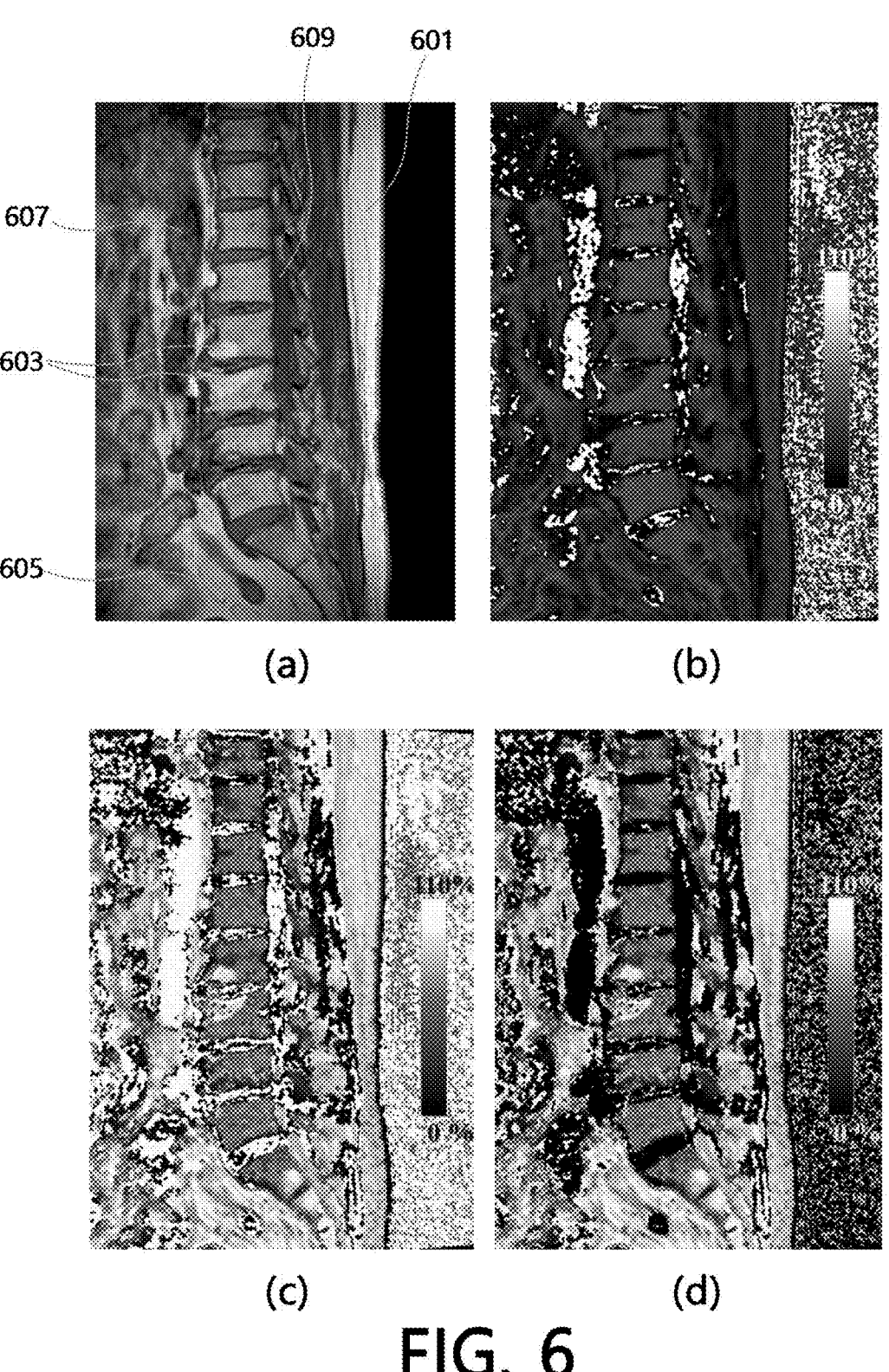
FIG. 6 is a screen example diagram illustrating a fat fraction map generated according to an embodiment of the present disclosure.

FIG. 6 is a screen example diagram illustrating a fat fraction map generated according to an embodiment of the present disclosure. FIG. 6 shows an example of generating the fat fraction map based on the multi-echo magnetic resonance image data obtained using a gradient echo pulse sequence in a 3 Tesla MRI.

Referring to FIG. 6, (A) of FIG. 6 is a sagittal T1-weighted MR image of the lumbar spine for referencing to an anatomical position. In (A) of FIG. 6, a bright portion represents a high-fat portion, and a dark portion represents a portion having a low-fat fraction, such as water or muscle. In (A) of FIG. 6, reference numerals 601, 603, 605, 607, and 609 indicate positions to be compared in the fat fraction map. Reference numeral 601 is dorsal subcutaneous fat, 603 is focal fatty degeneration on vertebral body, 605 is visceral fat, 607 is abdominal aorta, and 609 is intrathecal cerebrospinal fluid.

(B) of FIG. 6 is a fat fraction map generated using a conventional DIXON technique. Referring to (B) of FIG. 6, it can be seen that voxel values located in high-fat portions such as dorsal subcutaneous fat, focal fatty degeneration on vertebral body, and visceral fat are incorrectly displayed as low fat fraction values.

(C) of FIG. 6 is a fat fraction map created by determining high-fat voxels and non-high-fat voxels for each voxel using the high-fat voxel classification method according to the present disclosure and applying a different fat fraction equation for each voxel.

In addition, (D) of FIG. 6 is a fat fraction map in which noise is removed by performing noise removal by applying the first condition to the fourth condition in (C) of FIGS. 6. (C) and (D) of FIG. 6 show that the closer to a bright color (e.g., bright yellow or bright white, etc.) in the fat fraction map, the higher the fat signal fraction. It can be seen that the high-fat voxels such as dorsal subcutaneous fat, focal fatty degeneration on vertebral body, and visceral fat which are not correctly represented in (B) of FIG. 6 are correctly represented as voxels having high-fat fraction values in (C) and (D) of FIG. 6.

In particular, as shown in (D) of FIG. 6, by generating the fat fraction map through noise removal, it can be seen that the high-fat voxel portion is correctly displayed, and it can be seen that the blood flow artifacts and noise presented in the abdominal aorta and the intramedullary cerebrospinal fluid observed in (C) of FIG. 6 are removed. In addition, it can be seen that the background noise that occurred in the disc between the vertebral bodies and the empty space outside the back of the human body was also reduced.

As described above, the fat fraction map generated using the present disclosure is able to more accurately confirm the fat fraction value compared to the conventional method by displaying dorsal subcutaneous fat, focal fatty degeneration on vertebral body, and visceral fat, etc. in a bright color (e.g., bright yellow or bright white, etc.) compared to the conventional fat fraction map using the DIXON technique.

The embodiments of the present disclosure disclosed in the specification and the drawings are merely provided to easily describe the technical content of the present disclosure and to help understand the present disclosure, and are not intended to limit the scope of the present disclosure. Accordingly, it should be interpreted that all changes or modified forms derived based on the technical idea of the present disclosure are included in the scope of the present disclosure in addition to the embodiments disclosed herein.

INDUSTRIAL APPLICABILITY

The present disclosure can provide a method and a device for distinguishing a high-fat voxel and generating a fat fraction map using a magnitude-based multi-echo magnetic resonance image, thereby having industrial applicability.

What is claimed is:

1. A method for generating a fat fraction map, the method comprising:

obtaining, with a magnetic resonance scanner, three or more opposed-phase OP image data corresponding to an opposed-phase and three or more in-phase IP image data corresponding to an in-phase in accordance with a plurality of echo times of a subject;

confirming, with the magnetic resonance scanner, a voxel value for voxels constituting each of the image data;

determining, with the magnetic resonance scanner, a high-fat voxel in which high-fat is located among the image data based on the voxel value; and generating, with the magnetic resonance scanner, a fat fraction map by selectively applying different fat fraction equations in accordance with a result of the determination of the high-fat voxel.

2. The method of claim 1, wherein obtaining the three or more OP image data corresponding to the opposed-phase and the three or more IP image data corresponding to the in-phase comprises:

sequentially obtaining first OP image data, first IP image data, second OP image data, second IP image data, third OP image data, third IP image data, and fourth OP image data.

3. The method of claim 2, wherein determining the high-fat voxel comprises:

comparing the voxel value for the same voxels in the third IP image data and the fourth OP image data; and when the voxel value of the third IP image data is equal to or less than the voxel value of the fourth OP image data, determining the corresponding voxel as the high-fat voxel.

4. The method of claim 2, wherein determining the high-fat voxel comprises:

comparing the voxel value for the same voxels in the third OP image data and the fourth OP image data; and when the voxel value of the third OP image data is equal to or less than the voxel value of the fourth OP image data, determining the corresponding voxel as the high-fat voxel.

5. The method of claim 2, wherein determining the high-fat voxel comprises:

comparing the voxel value for the same voxels in the second OP image data and the third OP image data; and when the voxel value of the second OP image data is equal to or less than the voxel value of the third OP image data, determining the corresponding voxel as the high-fat voxel.

6. The method of claim 2, wherein generating the fat fraction map comprises:

calculating a fat fraction value by applying a first fat fraction equation to the determined high-fat voxel.

7. The method of claim 6, wherein generating the fat fraction map comprises:

calculating a fat fraction value by applying a second fat fraction equation to a voxel other than the high-fat voxel.

8. The method of claim 7, wherein generating the fat fraction map comprises:

generating the fat fraction map using the calculated fat fraction value.

9. The method of claim 8, after generating the fat fraction map, further comprising:

removing, with the magnetic resonance scanner, noise of the fat fraction map; and reconstructing the fat fraction map.

10. The method of claim 9, wherein removing the noise comprises:

determining a voxel satisfying any one of a first condition, a second condition, a third condition, and a fourth condition as noise and removing the noise from the fat fraction map.

11. The method of claim 10, wherein the first condition is a condition for determining whether a voxel among the plurality of voxels constituting the fat fraction map is less than a first threshold or exceeding a second threshold.

12. The method of claim 10, wherein the second condition is a condition for confirming whether the voxel value of the first IP image data is less than or equal to the voxel value of the second OP image data based on a comparison result of the voxel value for the same voxels in the first IP image data and second OP image data.

13. The method of claim 10, wherein the third condition is a condition for confirming whether the voxel value of the first IP image data is less than or equal to the voxel value of the second IP image data based on a comparison result of the voxel value for the same voxels in the first IP image data and second IP image data.

14. The method of claim 10, wherein the fourth condition is a condition for confirming whether a difference value of the voxel value of the voxels comprising the first IP image data minus the voxel value of the voxels comprising the second OP image data is less than or equal to the voxel value of the voxels comprising the first IP image data multiplied by a threshold value.

15. A device for generating a fat fraction map, the device comprising:
   a measuring portion configured to obtain three or more opposed-phase OP image data corresponding to an opposed-phase and three or more in-phase IP image data corresponding to an in-phase in accordance with to a plurality of echo times of a subject; and
   a controller configured to confirm a voxel value for voxels constituting each of the image data, determine a high-fat voxel in which high-fat is located among the image data based on the voxel value, and generate a fat fraction map by selectively applying different fat fraction equations in accordance with a result of the determination of the high-fat voxel.

16. The device of claim 15, wherein the measuring portion is configured to sequentially obtain first OP image data, first IP image data, second OP image data, second IP image data, third OP image data, third IP image data, and fourth OP image data.

17. The device of claim 16, wherein when the voxel value of the third IP image data is equal to or less than the voxel value of the fourth OP image data for to the same voxels or the voxel value of the third OP image data is equal to or less than the voxel value of the fourth OP image data or the voxel value of the second OP image data is equal to or less than the voxel value of the third OP image data, the controller is configured to determine the corresponding voxel as the high-fat voxel.

18. The device of claim 16, wherein the controller is configured to calculate a fat fraction value by applying a first fat fraction equation to the determined high-fat voxel.

19. The device of claim 18, wherein the controller is configured to calculate a fat fraction value by applying a second fat fraction equation to a voxel other than the high-fat voxel.

20. The device of claim 19, wherein the controller is configured to generate the fat fraction map using the calculated fat fraction value, remove noise of the fat fraction map, and reconstruct the fat fraction map.

21. The device of claim 20, wherein the controller is configured to determine a voxel that satisfies a first condition in the fat fraction map or that satisfies any one of a second condition, a third condition, and a fourth condition in at least two image data among the plurality of image data as noise and remove the noise from the fat fraction map.

* * * * *